United States Patent [19]

Duplatre et al.

[11] Patent Number: 4,645,284
[45] Date of Patent: Feb. 24, 1987

[54] TELEPHONE BUILDING ENTRANCE TERMINAL

[75] Inventors: Raymond Duplatre, Bellerose; Paul V. De Luca, Plandome Manor, both of N.Y.

[73] Assignee: Porta Systems Corp., Syosset, N.Y.

[21] Appl. No.: 806,344

[22] Filed: Dec. 9, 1985

Related U.S. Application Data

[62] Division of Ser. No. 698,922, Feb. 6, 1985, Pat. No. 4,575,169.

[51] Int. Cl.⁴ ............................................... H01R 4/00
[52] U.S. Cl. ............................... 339/94 A; 174/65 G; 339/44 M; 339/103 B
[58] Field of Search ................ 339/94, 144 R, 144 M, 339/126 RS, 43, 44, 103 B; 174/17 CT, 65 G, 152 G, 167

[56] References Cited

U.S. PATENT DOCUMENTS 2,324,791  7/1943  McLoughlin et al. ........... 174/65 G
3,499,097  3/1970  Widstrand ........................ 174/65 G
3,742,119  6/1973  Newman .......................... 174/65 G

FOREIGN PATENT DOCUMENTS 2240086  3/1974  Fed. Rep. of Germany ... 174/65 G
 285691  2/1965  Netherlands ..................... 174/65 G Primary Examiner—Gil Weidenfeld
Assistant Examiner—David L. Pirlot
Attorney, Agent, or Firm—Charles E. Temko

[57] ABSTRACT

An improved telephone building terminal for use with subscriber-owned equipment. The terminal includes a partition housing including a splice chamber for reception of incoming cable pairs and a second chamber accommodating protector modules and a connector block. Separate covers are hingedly mounted to overlie the splice chamber and the protector and connector chambers. The covers are so arranged that movement of one cover to closed position serves to provide locking means for the other cover whereby only a single padlock is required to prevent unauthorized access to the interior of the housing. Also disclosed is a cable sheath suitable for use in supporting cables of different diameters in openings leading to the splice chamber.

3 Claims, 8 Drawing Figures

TELEPHONE BUILDING ENTRANCE TERMINAL

RELATED APPLICATION

This application is a division of copending application Ser. No. 06/698,922 filed Feb. 6, 1985 now U.S. Pat. No. 4,575,169 under the title Telephone Building Entrance Terminal.

BACKGROUND OF THE INVENTION

This invention relates generally to the field of telephony, and more particularly to an improved telephone building entrance terminal for use with subscriber-owned equipment which has been increasingly common in recent years. While entrance terminals of this type used for individual subscriber pairs offer no particular design difficulties, those which are employed to service a relatively large number of individual circuits installed, for example, in office buildings and residential condominiums, tend to be more complex and require the provision of a housing element having separate splice chambers and chambers for the mounting of individual circuit protector modules and connector blocks. Because of constantly changing service equipment, it is essential that access to the terminal be available to the telephone company in a convenient manner.

It is usual to provide a cover overlying the above-mentioned chambers which is hingedly connected to a housing along one edge thereof, and which is secured in closed position by lockable means. When, as often occurs, the associated housing is mounted in relatively inaccessable areas, the opening of the cover by service personnel is usually not difficult, but the presence of the open cover, once opened, provides a hindrance to accessibility to the contents of the chambers disposed therebeneath. In some cases, it is not possible because of the presence of adjacent walls or other equipment to fully open the cover. It is known in the art to provide covers of a type which are not hingedly interconnected to the housing, but are fully removable. However, such covers tend to be less than fully effective from the standpoint of adequate sealing of the chambers, and lack adequate tamper-proof qualities.

SUMMARY OF THE INVENTION

Briefly stated, the invention contemplates the provision of an improved telephone building entrance terminal of the class described in which the above-mentioned disadvantages have been substantially eliminated. To this end, there is provided a unitary housing element defining a first splice chamber, and a second chamber accommodating protector and connector block assemblies. A separate cover is hingedly associated with each of the two chambers. One of the covers is provided with locking hasp means secured by a padlock or similar device. The same cover is provided with locking lugs which are brought into play by the closing of that cover in such manner as to project into an adjacent area to engage corresponding slots in the other of said covers, and secure the other cover in closed condition. When the covers are in opened condition, by virtue of substantially smaller overall size, they occupy considerably less space, and afford greater access to the interior of the underlying chambers.

The cover elements are provided with side and end walls as well as the usual front wall, so as to overlap parts of the housing element disposed therebeneath, when in closed condition to effect an adequate seal against the entry of moisture, vermin and the like. To this end, the invention also contemplates the provision of an improved sealing means disposed in openings in the housing provided for the introduction of incoming subscriber pair cables. The sealing means is in the form of solid plugs or cable sheaths, each of which is provided with grooved peripheries having plural effective diameters to permit a sealing action with both the housing elements and associated cover elements.

BRIEF DESCRIPTION OF THE DRAWINGS

In the drawings, to which reference will be made in the specification, similar, reference characters have been employed to designate corresponding parts throughout the several views.

DETAILED DESCRIPTION OF THE DISCLOSED INVENTION

Figure 1:
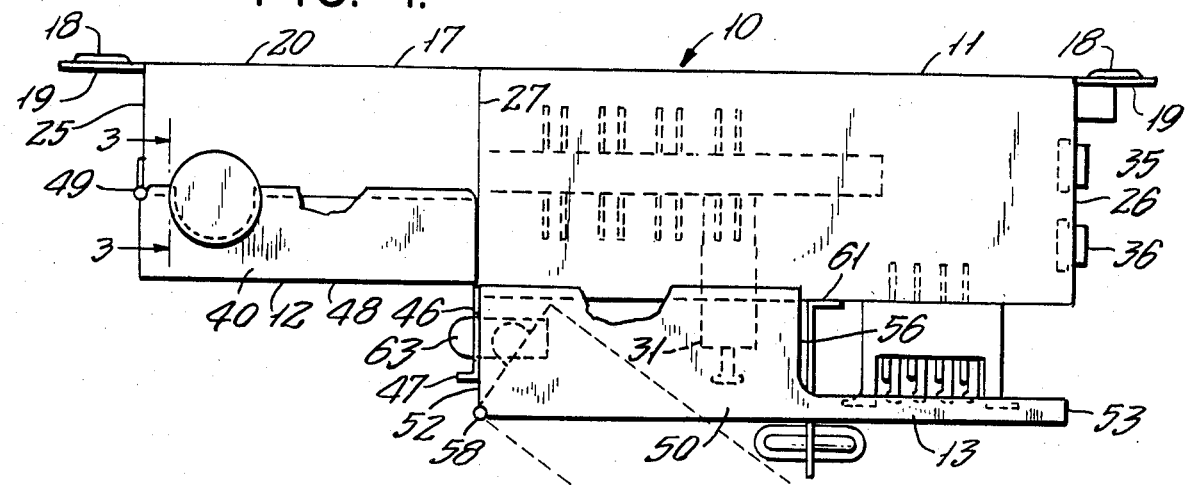
FIG. 1 is a a top plan view of an embodiment of the invention.

In accordance with the invention, the device, generally indicated by reference character 10, comprises broadly: a housing element 11, and first and second cover elements 12 and 13.

The housing element 11 is preferably formed from sheet metal stampings, and includes a rear wall 17 having mounting openings 18 extending between a forward surface 19 and a rearward surface 20. Secured to the rear wall are upper walls 21 and 22, lower walls 23 and 24, side walls 25 and 26 and a dividing septum 27 to define a first or splice chamber 28, and a second chamber 29 of somewhat larger dimension having means for accommodating a protector block 30 and accompanying modules 31 as well as a known connector block 32 of quick-clip type. The splice chamber 28 is provided with first and second cable entry openings 33 and 34 for the introduction of subscriber pair cables. Connectorized outlets 35 and 36 communicate with subscriber-owned equipment (not shown) in well-known manner.

The first cover element 12 is also of stamped sheet metal construction, and includes an upper wall 40, a lower wall 41, a first end wall 42, and side walls 43 and 44. A second side wall 45 includes an extended portion containing slotted openings, one of which is indicated by reference character 46 as well as a flange 47 permitting convenient manual engagement which overlies a front wall 48. Interconnection with the housing element 11 is preferably by means of a piano hinge 49 in well-known manner.

The second cover element 13 is somewhat larger, although of generally similar configuration, and includes an upper wall 50, a lower wall 51, a pair of end walls 52 and 53, a septum 56 and a front wall 57. Similar hinge means 58 interconnects the second cover element in the rear of the openings 46. A slotted opening 59 in the front wall 57 accommodates a welded hasp 60 on a fixed wall 61 overlying the second chamber 29.

Figure 2:
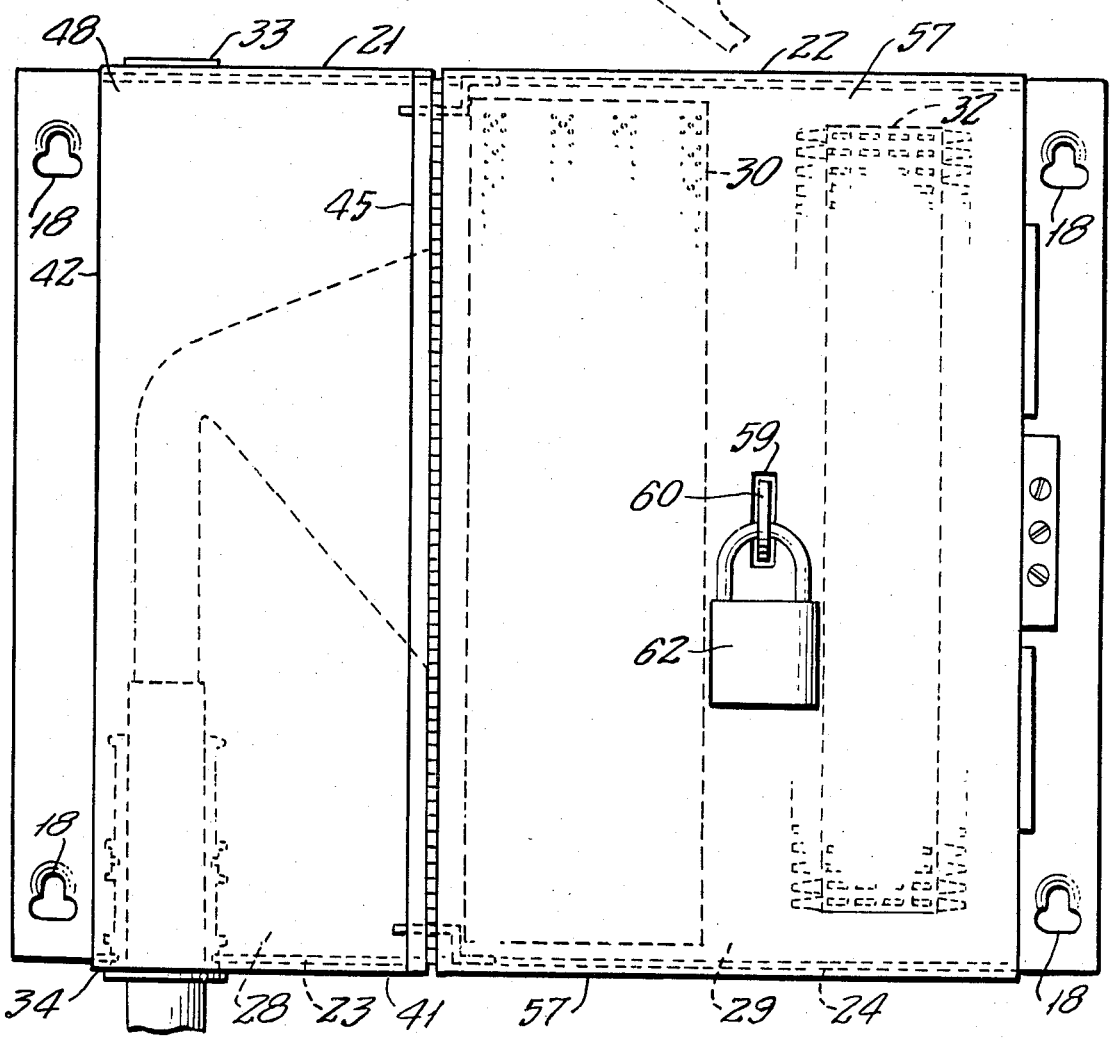
FIG. 2 is a front elevational view thereof.
Figure 3:
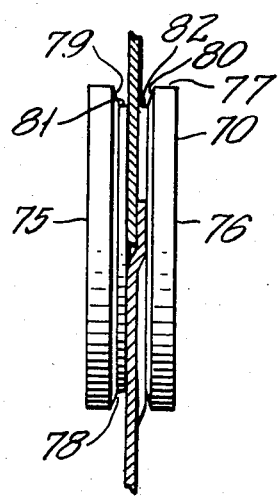
FIG. 3 is a transverse sectional view thereof as seen from the plane 3—3 in FIG. 1.
Figure 4:
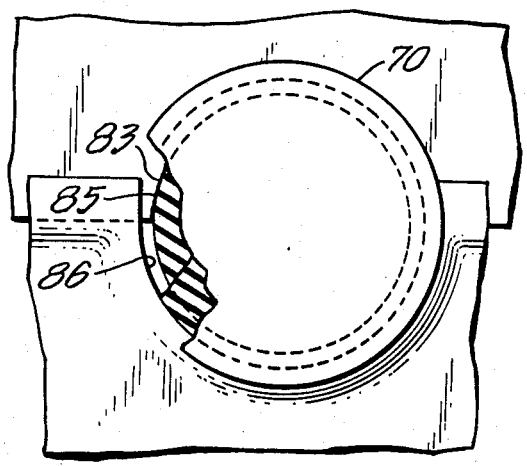
FIG. 4 is a side elevational view of a closure plug element forming part of the disclosed embodiment.

From a comparison of FIGS. 1 and 2, it will be apparent that access to both chambers by authorized personnel may be had by opening the padlock 62 and first swinging outwardly the second cover element 13. This will simultaneously remove the locking tabs 63 from engagement with the slotted openings 46 (FIG. 1) thus permitting opening of the first cover element 12 for access to the splice chamber. Because the overall size of the cover elements 12 and 13 is considerably smaller than if the cover elements were made as a single piece, they need extend outwardly a far smaller distance when opened, and thus more space is available to service personnel. Once unlocked, it is possible to close the cover element over an area which is not being worked upon without interference with the other cover element.

FIGS. 3 to 8, inclusive, illustrate an improved sealing means effectively used in closing openings leading to the splice chamber when the cover elements are in closed condition. It will be observed in FIG. 2 that openings for pair cables are disposed partially within the housing element 11 and partially within the first cover element 12. Since an overlapping relation occurs when the cover element is closed, it is necessary not only to provide means for preventing damage to the cable, but an effective sealing means to prevent entrance of moisture, vermin and the like from the environs into the splice chamber.

Where the opening is not required for the entrance of a cable, a simple plug element 70 (FIG. 4) may be employed. This can be a unitary molding of natural or synthetic rubber, and is merely positioned between the two parts of the opening prior to closure. The element 70 provides this function. Where a less than full-sized cable penetrates the opening, this is accommodated by a sleeve element 71. A full-sized cable (300 pair) is accommodated by a sheath 72 of somewhat different configuration.

The plug element 70 may be formed as a simple molding from natural or synthetic rubber or other suitable synthetic resinous material. It is bounded by first and second side surfaces 75 and 76, and an annular side surface 77 having a continuous stepped recess 78 therein. The recess includes first and second frustoconical surfaces 79 and 80 leading to first and second cylindrical surfaces 81 and 82. Disposed medially between these surfaces is a deeper recess 83 of substantially smaller diameter.

When the element 70 is installed, a semi-circular opening 85 in the housing corresponds to the bottom surface of the recess 83, while a second opening 86 in the cover element corresponds to the diameter of the surfaces 81 and 82. Installation is made by merely positioning the element 70 in either of the semicircular recesses and closing the cover to effect a complete sealing action. By providing two cylindrical surfaces at 81 and 82, the orientation of the plug element 70 is of no consequence, since in either orientation, one of the surfaces 81-82 will be engaged by the opening in the cover element 12.

Figure 5:
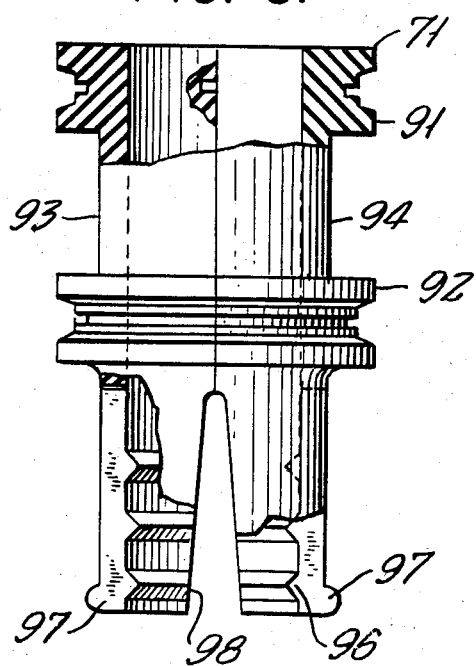
FIG. 5 is a view in elevation, partly in section, of a cable sheath element forming a part of the embodiment.

FIG. 5 illustrates a cable sheath 71 suitable for use with a cable of diameter substantially smaller than that of the opening formed in the device 10. It includes first and second flanges 91 and 92 which incorporate the structure of the plug element 70 and which are disposed in spaced relation along first and second symmetrical members 93 and 94 which form a shaft-like extension for accommodation of the cable. A free end 96 is formed by contractible fingers 97 which are divided by interstices 98 which are maintained in contracted condition upon the cable (not shown) by suitable taping applied to the outer surface of the fingers 97.

Figure 7:
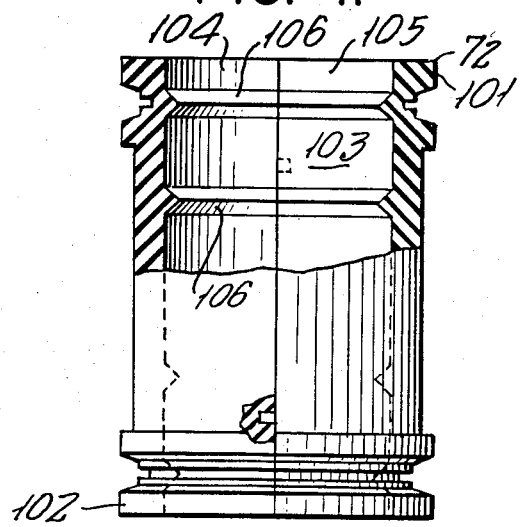
FIG. 7 is a side elevational view, partly in section, showing a second form of cable sheath forming a part of the embodiment.
Figure 6:
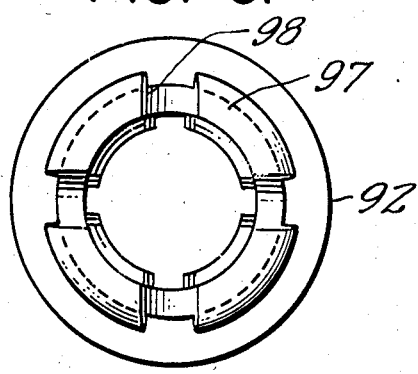
FIG. 6 is an end elevational view thereof as seen from the right-hand portion of FIG. 5.
Figure 8:
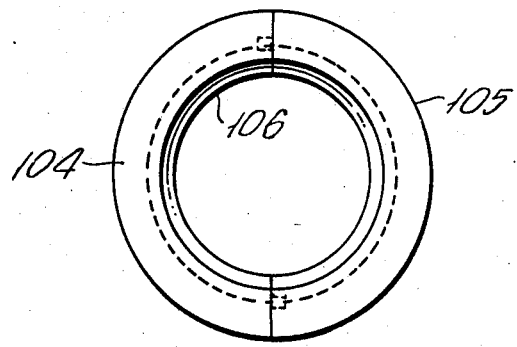
FIG. 8 is an end elevational view thereof as seen from the right-hand portion of FIG. 7.

FIGS. 7 and 8 illustrate a second form of cable sheath employed with a pair cable of full diameter. This form of sheath 72, includes first and second flanges 101 and 102 positioned at opposite ends thereof, and, as in the case of the structure shown in FIGS. 5 and 6, the sheath is formed to include first and second cylindrical members 104 and 105. The inner surface 103 is provided with a plurality of annular projections 106 which provide suitable strain relief to the cable after installation. This form of sheath is also suitable for use in interconnecting a plurality of devices 10, in which condition one of the flanges 101-102 is engaged with an opening in the splice chamber of a first device 10, and the other in a similar opening in a second device 10 (not shown).

We wish it to be understood that we do not consider the invention limited to the precise details of structure shown and set forth in this specification, for obvious modifications will occur to those skilled in the art to which the invention pertains.

We claim:

1. Improved sealing means for sealing a generally circular opening in a housing having a main body and an openable cover selectively engaged thereon, said opening being partially formed by a wall of said housing and a wall of said cover when said cover is in at least partially overlapped relation, said means comprising: that part of said opening in said wall of said main body having a first diameter, that part of said opening in said wall of said cover having a second diameter; a generally circular sealing member having a curvilinear side surface, said side surface having a continuous recess therein of stepped cross-sectional configuration to form a plurality of grooves of differing diameter, one of said grooves being of diameter corresponding to that part of said opening in said wall of said main body, and another of said grooves being of a diameter corresponding to that part of said opening formed by said cover; said first and second grooves being laterally spaced from each other a distance corresponding to the degree of overlap upon engagement of said cover with said main body; whereby said sealing member may be simultaneously engaged with said opening with said main body and cover members upon the closing of said cover member upon said said main body; there being a third groove of a diameter common to the groove of larger diameter of said first and second grooves, and symmetrically disposed on either side of said groove of lesser diameter, whereby said sealing member may be positioned in either of two orientations with respect to said main body and said cover.

2. A sealing member in accordance with claim 1, in the form of a solid generally planar plug.

3. A sealing member in accordance with claim 1, in the form of a tubular sheath for engaging a telephone pair cable conducted through said generally circular opening.

* * * * *